United States Patent
Gabrys et al.

(10) Patent No.: US 11,294,002 B2
(45) Date of Patent: Apr. 5, 2022

(54) CONCAVE CAVITY FOR INTEGRATED MICROFABRICATED SENSOR

(71) Applicant: TEXAS INSTRUMENTS INCORPORATED, Dallas, TX (US)

(72) Inventors: Ann Gabrys, Woodside, CA (US); Nathan Brockie, Edinburgh (GB); Terry Dyer, Largs (GB); Roozbeh Parsa, Portola Valley, CA (US); William French, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/918,098

(22) Filed: Jul. 1, 2020

(65) Prior Publication Data

US 2020/0333406 A1    Oct. 22, 2020

Related U.S. Application Data

(62) Division of application No. 15/457,669, filed on Mar. 13, 2017, now Pat. No. 10,712,401.

(51) Int. Cl.
*G01R 33/032* (2006.01)
*G04F 5/14* (2006.01)

(52) U.S. Cl.
CPC ............. *G01R 33/032* (2013.01); *G04F 5/14* (2013.01)

(58) Field of Classification Search
CPC .................................. G01R 33/032; G04F 5/14
See application file for complete search history.

(56) References Cited

U.S. PATENT DOCUMENTS

| | | | | |
|---|---|---|---|---|
| 2006/0022761 A1* | 2/2006 | Abeles | ...................... | G04F 5/14 331/94.1 |
| 2008/0121042 A1* | 5/2008 | Miller | ...................... | G01H 3/04 73/649 |
| 2011/0054938 A1* | 3/2011 | Hood | ...................... | A61B 5/00 705/3 |
| 2012/0079876 A1* | 4/2012 | Stroock | .............. | G01N 33/0098 73/64.51 |
| 2015/0362394 A1* | 12/2015 | Shimoyama | .......... | G01L 9/0001 73/702 |
| 2016/0169989 A1* | 6/2016 | Suzuki | ................... | G01R 33/26 324/305 |

OTHER PUBLICATIONS

U.S. Appl. No. 15/457,608, filed Mar. 13, 2017 (41 pages).

* cited by examiner

*Primary Examiner* — Akm Zakaria
(74) *Attorney, Agent, or Firm* — Andrew R. Ralston; Charles A. Brill; Frank D. Cimino

(57) ABSTRACT

An integrated microfabricated sensor includes a sensor cell having a cell body, a first window attached to the cell body, and a second window attached to the cell body. The cell body laterally surrounds a cavity, so that both windows are exposed to the cavity. The sensor cell contains a sensor fluid material in the cavity. The cavity has concave profiles at cell body walls, so that the cavity is wider in a central region, approximately midway between the first window and the second window, than at the first surface and at the second surface. The cell body walls of the cell body have acute interior angles at both windows. The cell body is formed using an etch process that removes material from the cell body concurrently at the first surface and the second surface, forming the acute interior angles at both the first surface and the second surface.

20 Claims, 8 Drawing Sheets

CONCAVE CAVITY FOR INTEGRATED MICROFABRICATED SENSOR

CROSS-REFERENCE TO RELATED APPLICATIONS

This application is a divisional of U.S. patent application Ser. No. 15/457,669 filed Mar. 13, 2017, which is incorporated herein by reference in its entirety.

FIELD

This disclosure relates to the field of integrated microfabricated sensors. More particularly, this disclosure relates to cavity architecture in integrated microfabricated sensors.

BACKGROUND

A sensor cell of an integrated microfabricated sensor commonly has a sandwich structure with a cell body of crystalline silicon between two windows, with a cavity extending through the cell body, between the windows. The sensor cell may be fabricated by etching the cavity in the silicon using a crystallographic wet etch process which produces faceted cell body walls, so that the cavity is wider at one end than at the other end.

After the cavity is etched, the first window is attached. In one approach, the window is attached to the side of the cell body with the narrow cavity end, so that the wide end of the cavity is open. A solution of alkali metal salt, such as cesium azide dissolved in water or alcohol, is dispensed into the cavity. The solvent is removed by evaporation. This approach has a problem with wicking of the solution onto the exposed surface of the cell body where the second window is attached, because the surfaces are hydrophilic, and because the cell body wall has an obtuse interior angle at the exposed surface, facilitating wicking onto the exposed surface. As the alkali metal salt precipitates from the removal of the solvent, the wicking is exacerbated by diffusion of the solution through the precipitated metal salt. The precipitated metal salt on the exposed surface of the cell body interferes with the attachment of the second window. The cavity is approximately filled with the solution, to attain a desired amount of the metal in the cavity. Increasing the concentration, to reduce the fill volume, exacerbates the wicking, and has not been effective in solving the problem. Making the cavity surfaces hydrophobic, to avoid wicking, tends to precipitate the metal salt on the middle area of the window, obscuring a signal path through the cell.

In another approach, the first window is attached to the other surface of the cell body, so that the cavity is narrower at the open end. In this approach, the solution tends to precipitate the metal salt in the center of the window. This undesired precipitation in the signal path is a result of the obtuse interior angle of the cell body wall at the surface abutting the window.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated microfabricated sensor includes a sensor cell having a cell body, a first window, and a second window. The cell body has a first surface, which is flat, and a second surface, which is also flat, parallel to the first surface and located on an opposite side of the cell body from the first surface. The cell body laterally surrounds a cavity which extends from the first surface to the second surface. The first window is attached to the first surface and extends across the cavity, so that the first window is exposed to the cavity. The second window is attached to the second surface and extends across the cavity, so that the second window is also exposed to the cavity. The sensor cell contains a sensor fluid material in the cavity. The cavity has concave profiles at cell body walls, so that the cavity is wider in a central region, approximately midway between the first window and the second window, than at the first surface and at the second surface. The cell body walls of the cell body have acute interior angles at both windows.

The cell body is formed using an etch process that removes material from the cell body concurrently at the first surface and the second surface, forming the acute interior angles at both the first surface and the second surface. The first window is attached, and a solution of metal salt in a solvent is dispensed into the cavity. The solvent is removed by evaporation. The second window is subsequently attached.

DETAILED DESCRIPTION

Figure 1:
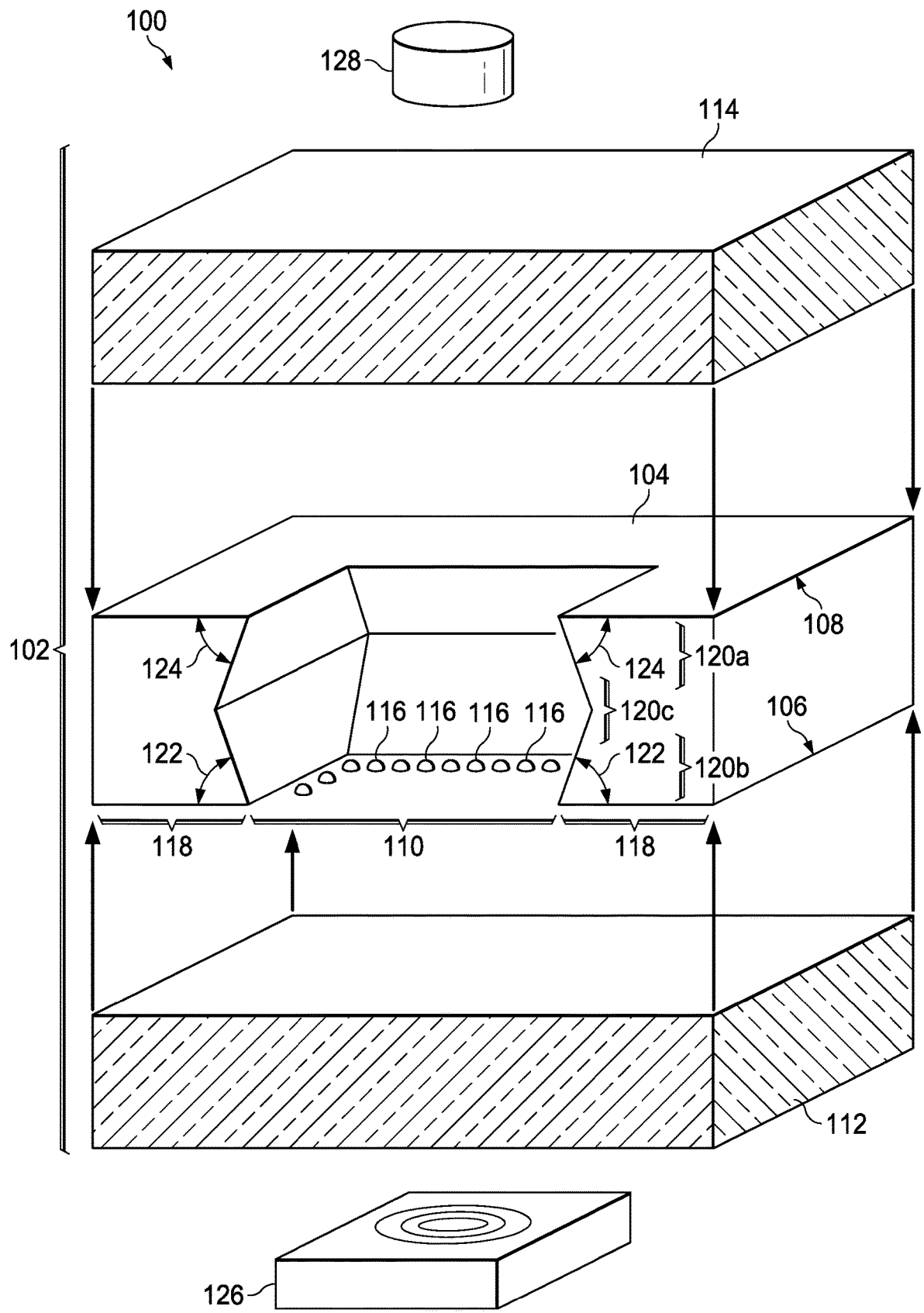
FIG. 1 is an exploded view of an example integrated microfabricated sensor.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent application is related and hereby incorporated by reference: U.S. patent application Ser. No. 15/457,608, filed simultaneously with this application). With its mention in this section, this patent application is not admitted to be prior art with respect to the present invention.

An integrated microfabricated sensor which may be, for example, an integrated microfabricated atomic clock (MFAC) or an integrated microfabricated atomic magnetometer (MFAM), includes a sensor cell having a cell body, a first window, and a second window. The cell body has a first surface, which is flat, and a second surface, which is also flat, parallel to the first surface and located on an opposite side of the cell body from the first surface. The cell body laterally surrounds a cavity which extends from the first surface to the second surface. The first window is attached to the first surface and extends across the cavity, so that the first window is exposed to the cavity. The second window is attached to the second surface and extends across the cavity, so that the second window is also exposed to the cavity. The sensor cell contains a sensor fluid material, for example a material including cesium or rubidium, in the cavity.

The cavity has cell body walls with concave profiles, wherein the cell body walls have a first boundary region along the first surface, a second boundary region along the second surface, and a central region between the first surface and the second surface, so that the cavity is wider in the central region, than at the first boundary region and at the second boundary region. The cell body walls of the cell body have acute interior angles at both the first surface and the second surface, that is, a first interior angle from the first surface through the cell body to the cell body wall at the first surface is less than 90 degrees, and a second interior angle from the second surface through the cell body to the cell body wall at the second surface is less than 90 degrees. The concave profiles may include planar facets, and may include curved surface segments.

The integrated microfabricated sensor includes a signal emitter located proximate to the first window or the second window. In one context of the instant disclosure, the signal emitter being proximate to the first window or the second window may be manifested by the signal emitter being located within a few millimeters of the first window or the second window and facing the first window or the second window. In another context, the signal emitter being proximate to the first window or the second window may be manifested by the signal emitter being located within a few millimeters of the first window or the second window and being configured to emit an input signal into the cavity through at least one of the first window or the second window. The integrated microfabricated sensor further includes a signal detector located proximate to the first window or the second window. In one context of the instant disclosure, the signal detector being proximate to the first window or the second window may be manifested by the signal detector being located within a few millimeters of the first window or the second window and facing the first window or the second window. In another context, the signal detector being proximate to the first window or the second window may be manifested by the signal detector being located within a few millimeters of the first window or the second window and being configured to detect an output signal from the cavity through at least one of the first window or the second window.

The cell body is formed using an etch process that removes material from the cell body concurrently at the first surface and the second surface, forming the acute interior angles at both the first surface and the second surface. The first window is attached, and a solution of metal salt in a solvent is dispensed into the cavity. The solvent is removed by evaporation. The second window is subsequently attached.

For the purposes of this disclosure, the term "lateral" is understood to refer to a direction parallel to the first surface and the second surface the cell body. The term "vertical" is understood to refer to a direction perpendicular to the first surface and the second surface the cell body. The term "exterior" is understood to refer to lateral surfaces of the cell body outside of the cavity.

It is noted that terms such as top, bottom, front, back, over, above, under, and below may be used in this disclosure. These terms should not be construed as limiting the position or orientation of a structure or element, but should be used to provide spatial relationship between structures or elements.

FIG. 1 is an exploded view of an example integrated microfabricated sensor. The integrated microfabricated sensor 100 includes a sensor cell 102, which includes a cell body 104 having a first surface 106 and a second surface 108. The first surface 106 is flat. The second surface 108 is also flat, and is parallel to the first surface 106. The second surface is located on an opposite side of the cell body 104 from the first surface 106. The cell body 104 laterally surrounds a cavity 110. The cavity 110 extends from the first surface 106 through the cell body 104 to the second surface 108. The cell body 104 may include, for example, primarily crystalline silicon.

A first window 112 is attached to the cell body 104 on the first surface 106 and extends across the cavity 110, so that the first window 112 is exposed to the cavity 110. A second window 114 is attached to the cell body 104 on the second surface 108 and extends across the cavity 110, so that the second window 114 is also exposed to the cavity 110. The sensor cell 102 contains a sensor fluid material 116, for example cesium or rubidium, in the cavity 110. The sensor fluid material 116 may be primarily in the form of a condensed state of a sensor fluid. The sensor fluid may be, for example, cesium vapor or rubidium vapor, and the condensed state of the sensor fluid may be solid cesium or solid rubidium, respectively. Alternatively, the sensor fluid material 116 may be a salt such as cesium azide ($CsN_3$). Other materials for the sensor fluid and the sensor fluid material 116 are within the scope of the instant example.

The cell body 104 has cell body walls 118 with concave profiles facing the cavity 110, wherein the cell body walls 118 have a first boundary region 120a along the first surface 106, a second boundary region 120b along the second surface 108, and a central region 120c between the first surface 106 and the second surface 108, so that the cavity 110 is wider in the central region 120c, than at the first boundary region 120a and at the second boundary region 120b. In the instant example, the cell body walls 118 have facets extending to the first surface 106 and to the second surface 108. The cell body walls 118 have a first interior angle 122 which is acute, extending from the cavity 110 through the cell body wall 118 to the first surface 106, around a perimeter of the cavity 110 at the first surface 106. The first interior angle 122 may vary in value from point to point around the perimeter of the cavity 110, but remains acute at each point. Similarly, the cell body walls 118 have a second interior angle 124, extending from the cavity 110 through the cell body wall 118 to the second surface 108, which is acute around the perimeter of the cavity 110 at the second surface 108.

The integrated microfabricated sensor 100 includes a signal emitter 126 located outside of the sensor cell 102, proximate to the first window 112. The integrated microfabricated sensor 100 further includes a signal detector 128 located outside of the sensor cell 102, proximate to the second window 114. A signal path extends from the signal emitter 126 through the first window 112, through the cavity 110, and through the second window 114, to the signal detector 128. The acute values of the first interior angle 122 and the second interior angle 124 may advantageously induce disposition of the sensor fluid material 116 on the first window 112 or the second window 114 around the perimeter of the cavity 110 and thus out of the signal path at the first window 112 and at the second window 114.

Figure 2A:
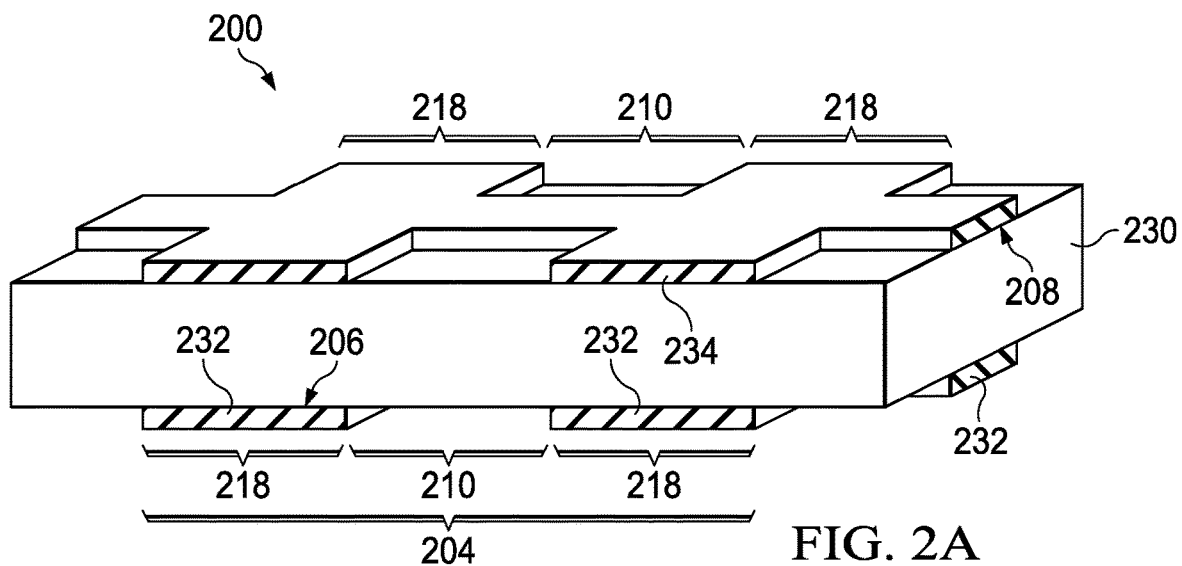
FIG. 2A through FIG. 2H are views of an integrated microfabricated sensor, depicted in successive stages of an example method of formation.

FIG. 2A through FIG. 2H are views of an integrated microfabricated sensor, depicted in successive stages of an example method of formation. Referring to FIG. 2A, a body substrate 230 is provided which includes areas for cell bodies, including the cell body 204 of the integrated microfabricated sensor 200. The body substrate 230 may be, for example, a silicon wafer, 500 micrometers to 3 millimeters thick. The body substrate 230 has a first surface 206 which is flat, and a second surface 208 which is also flat. The second surface 208 is parallel to, and located opposite from, the first surface 206.

In the instant example, a first etch mask 232 and a second etch mask 234 are formed on the first surface 206 and the second surface 208, respectively. The first etch mask 232 covers areas on the first surface 206 for cell body walls 218 and exposes areas for cavities 210 of the cell bodies. Similarly, the second etch mask 234 covers areas on the second surface 208 for the cell body walls 218 and exposes areas for the cavities 210.

The first etch mask 232 and the second etch mask 234 may be formed, for example, by forming a layer of silicon dioxide 5 nanometers to 20 nanometers thick concurrently on the first surface 206 and the second surface 208 by a thermal oxidation process, followed by forming a layer of silicon nitride 100 nanometers to 500 nanometers thick concurrently on the first surface 206 and the second surface 208 by a low pressure chemical vapor deposition (LPCVD) process or a hotwall atmospheric pressure chemical vapor deposition (APCVD) process. Subsequently, a first temporary mask of photoresist, not shown in FIG. 2A, may be formed on the layer of silicon nitride on the first surface 206 by a photolithographic process, and the silicon nitride and silicon dioxide may be removed in areas exposed by the first temporary mask by a plasma etch process, or a reactive ion etch (ME) process, using halogen and oxygen radicals, leaving the first etch mask 232 in place, followed by removing the first temporary mask. After the first etch mask 232 is thus formed, a second temporary mask of photoresist, not shown in FIG. 2A, may be formed on the layer of silicon nitride on the second surface 208, and the silicon nitride and silicon dioxide may be removed in areas exposed by the second temporary mask, leaving the second etch mask 234 in place, followed by removing the second temporary mask. Other methods for forming the first etch mask 232 and the second etch mask 234 are within the scope of the instant example. Silicon dioxide of the layer of silicon dioxide under the silicon nitride may be removed after the silicon nitride on both the first surface 206 and the second surface 208 is etched, for example, by a wet etch of an aqueous solution of buffered hydrofluoric acid.

Figure 2B:
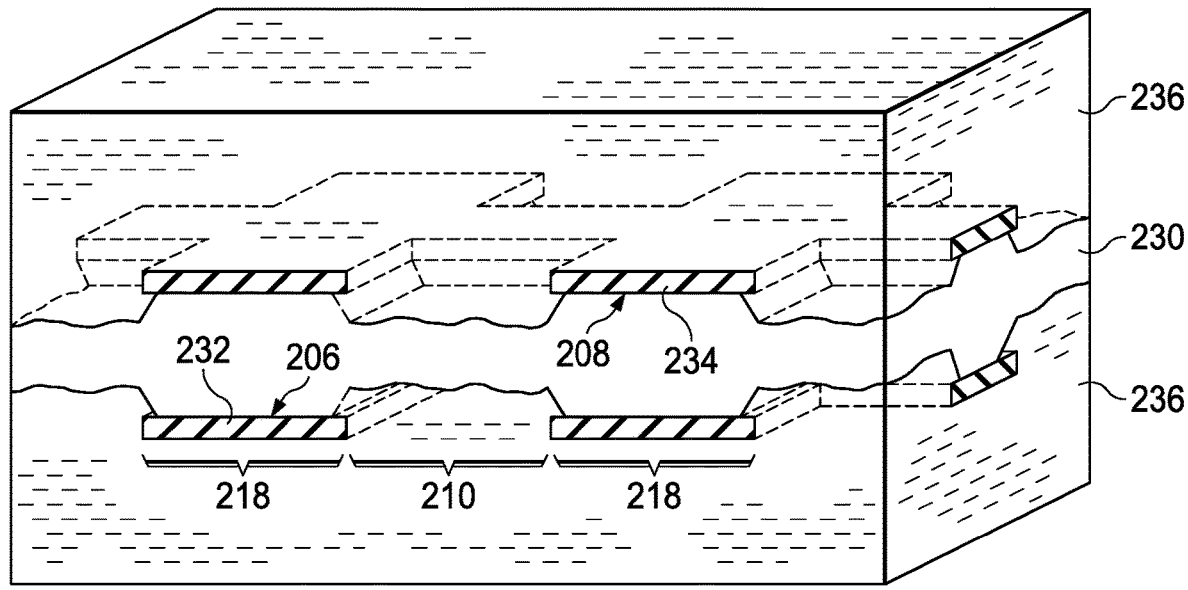

Referring to FIG. 2B, substrate material of the body substrate 230 is removed in areas exposed by the first etch mask 232 and the second etch mask 234 by an etch process, for example by a wet etch bath 236 as depicted. If the body substrate 230 is a silicon wafer, the wet etch bath 236 may include an aqueous alkaline solution such as potassium hydroxide or tetramethyl ammonium hydroxide. The wet etch bath 236 may remove silicon and undercut the first etch mask 232 and the second etch mask 234 to form faceted surfaces on [111] crystal planes. FIG. 2B depicts the body substrate 230 partway through the etch process. The etch process of the instant example is continued until the substrate material of the body substrate 230 is completely removed in the cavity 210, and the profile of the body substrate 230 in the cavity 210 is reversed, to provide acute interior angles around perimeters of the cavity 210 at the first surface 206 and the second surface 208.

Figure 2C:
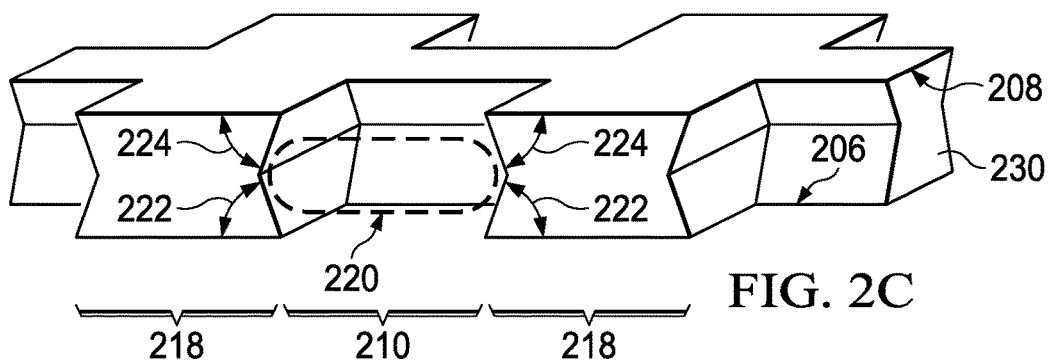

FIG. 2C depicts the body substrate 230 after the etch process of FIG. 2B is completed and after the first etch mask 232 and the second etch mask 234 of FIG. 2B have been removed. Silicon nitride in the first etch mask 232 and the second etch mask 234 may be removed, for example, by a wet etch of an aqueous solution of phosphoric acid. Silicon dioxide in the first etch mask 232 and the second etch mask 234 may be removed, for example, by a wet etch of an aqueous solution of buffered hydrofluoric acid. In the instant example, the cell body walls 218 have faceted concave profiles, as a result of the crystallographic etch mechanism of the wet etch 236 of FIG. 2B. The cavity 210 is wider in a central region 220, approximately midway between the first surface 206 and the second surface 208, than at the first surface 206 and at the second surface 208. The cell body walls 218 have a first interior angle 222 at the first surface 206 which is acute around a perimeter of the cavity 210 at the first surface 206. Similarly, the cell body walls 218 have a second interior angle 224 at the second surface 208, which is acute around the perimeter of the cavity 210 at the second surface 208. Other wall profiles having the concave profiles and the acute interior angles 222 and 224 are within the scope of the instant example. The first surface 206 and the second surface 208 may be cleaned or otherwise treated to provide a desired bond to a first window and a second window, respectively.

Figure 2D:
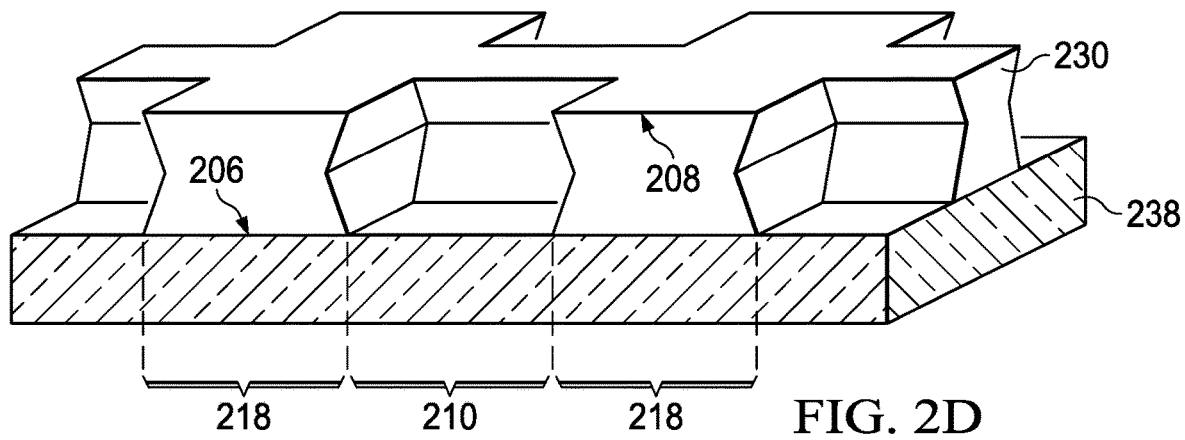

Referring to FIG. 2D, a first window substrate 238 is attached to the body substrate 230, on the first surface 206. The first window substrate 238 may be, for example, a glass wafer. The first window substrate 238 may be attached to the body substrate 230 by an anodic bonding process or other process appropriate for providing a desired hermetic seal.

Figure 2E:
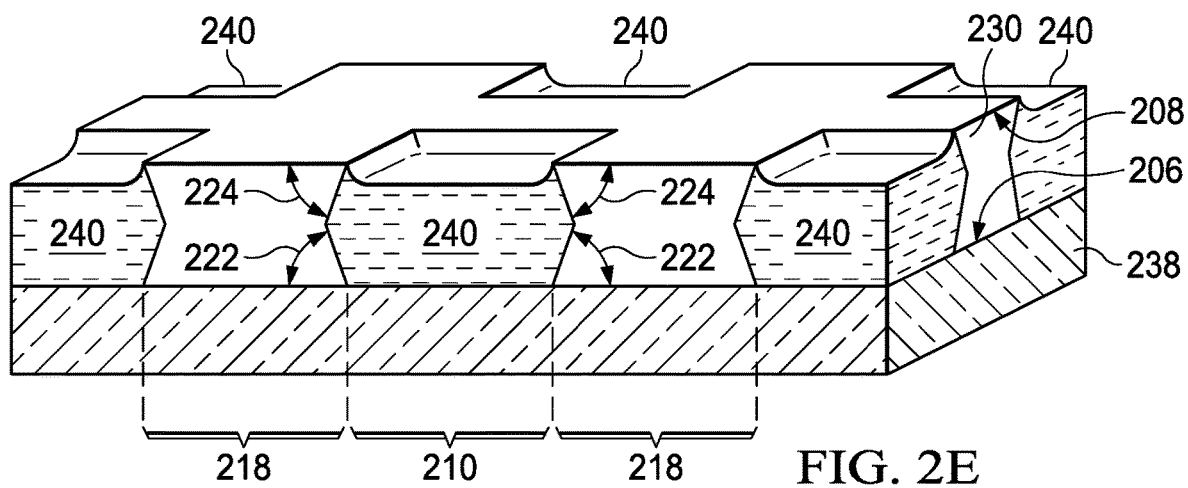

Referring to FIG. 2E, a sensor fluid liquid solution 240 of a sensor fluid material dissolved in a solvent is disposed in the cavity 210. The sensor fluid liquid solution 240 may include, for example, sensor fluid material of cesium azide dissolved in a solvent of water or alcohol. The sensor fluid liquid solution 240 may also be disposed in additional cavities in the body substrate 230. The sensor fluid liquid solution 240 may approximately fill the cavity 210. The cell body walls 218 may have hydrophilic surfaces, so that the sensor fluid liquid solution 240 forms a positive meniscus at the cell body walls 218, as depicted in FIG. 2E.

Substantially all of the solvent is subsequently removed from the sensor fluid liquid solution 240 by evaporation, leaving the sensor fluid material in the cavity 210. Evaporation of the solvent may be facilitated by heating the sensor fluid liquid solution 240, reducing an ambient pressure over the sensor fluid liquid solution 240, and/or flowing gas over the sensor fluid liquid solution 240 to remove solvent vapor.

As the solvent evaporates, the sensor fluid material precipitates from the sensor fluid liquid solution 240 onto the cell body walls 218. The first interior angle 222 being acute advantageously enhances precipitation of the sensor fluid material onto the first window substrate 238 at a perimeter of the cavity 210, thus avoiding precipitation in a signal path. The second interior angle 224 being acute advantageously reduces wicking of the sensor fluid liquid solution 240 onto the second surface 208 and hence reduces precipitation of the sensor fluid material onto the second surface 208. If care is taken in disposing the sensor fluid liquid solution 240 into the cavity 210, substantially no precipitation of the sensor fluid material onto the second surface 208 is observed.

Figure 2F:
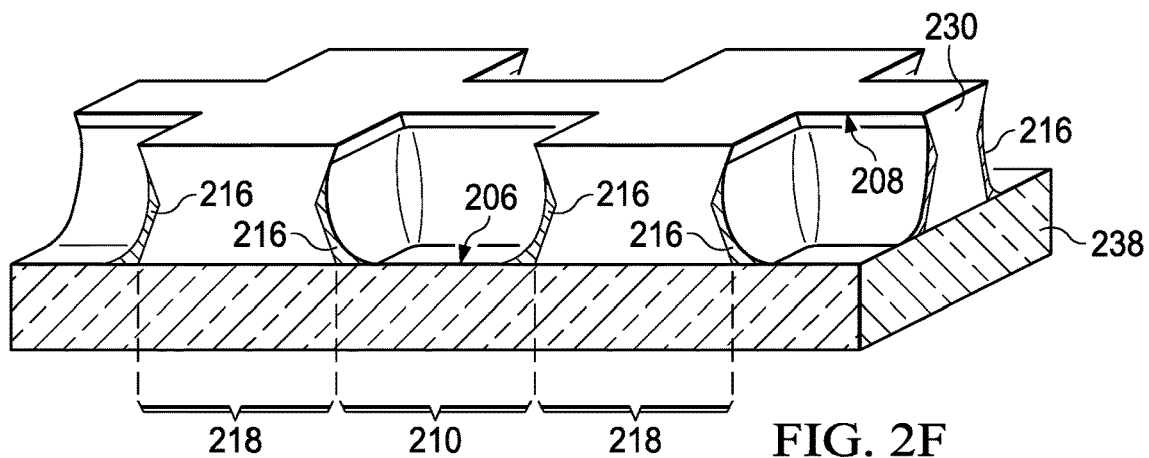

FIG. 2F depicts the body substrate 230 and attached first window substrate 238 after the solvent is evaporated from the sensor fluid liquid solution 240 of FIG. 2E. The sensor fluid material 216 is precipitated on the cell body walls 218 and on the first window substrate 238 around a perimeter of the cavity 210.

Figure 2G:
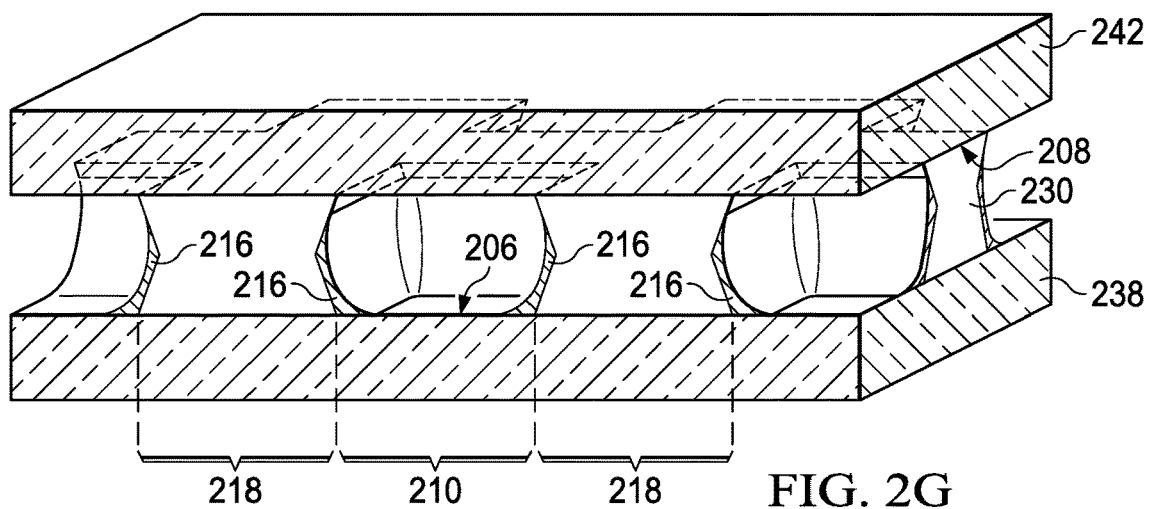

Referring to FIG. 2G, a second window substrate 242 is attached to the body substrate 230 on the second surface 208. The second window substrate 242 may have a similar composition and structure as the first window substrate 238. The second window substrate 242 may be attached to the body substrate 230 by a process similar to that used to attach the first window substrate 238. Reducing precipitation of the sensor fluid material 216 on the second surface 208 may advantageously improve reliability of the seal between the second window substrate 242 and the body substrate 230.

Figure 2H:
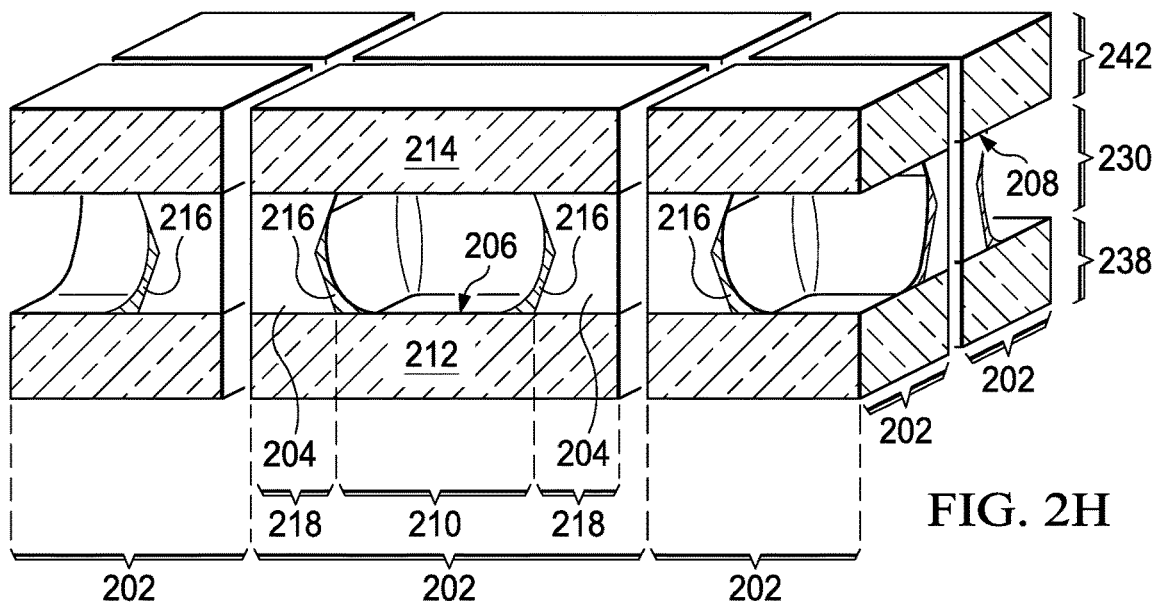

Referring to FIG. 2H, the body substrate 230 with the attached first window substrate 238 and second window substrate 242 are singulated to form a sensor cell 202 of the integrated microfabricated sensor. The singulated first window substrate 238 provides a first window 212 of the sensor cell 202. Similarly, the singulated second window substrate 242 provides a second window 214 of the cell body 202. The body substrate 230 with the attached first window substrate 238 and second window substrate 242 may be singulated by sawing or scribing. Additional sensor cells 202 may be formed by the singulation process. The sensor cell 202 is subsequently assembled into the integrated microfabricated sensor, for example as depicted in FIG. 1.

Figure 3:
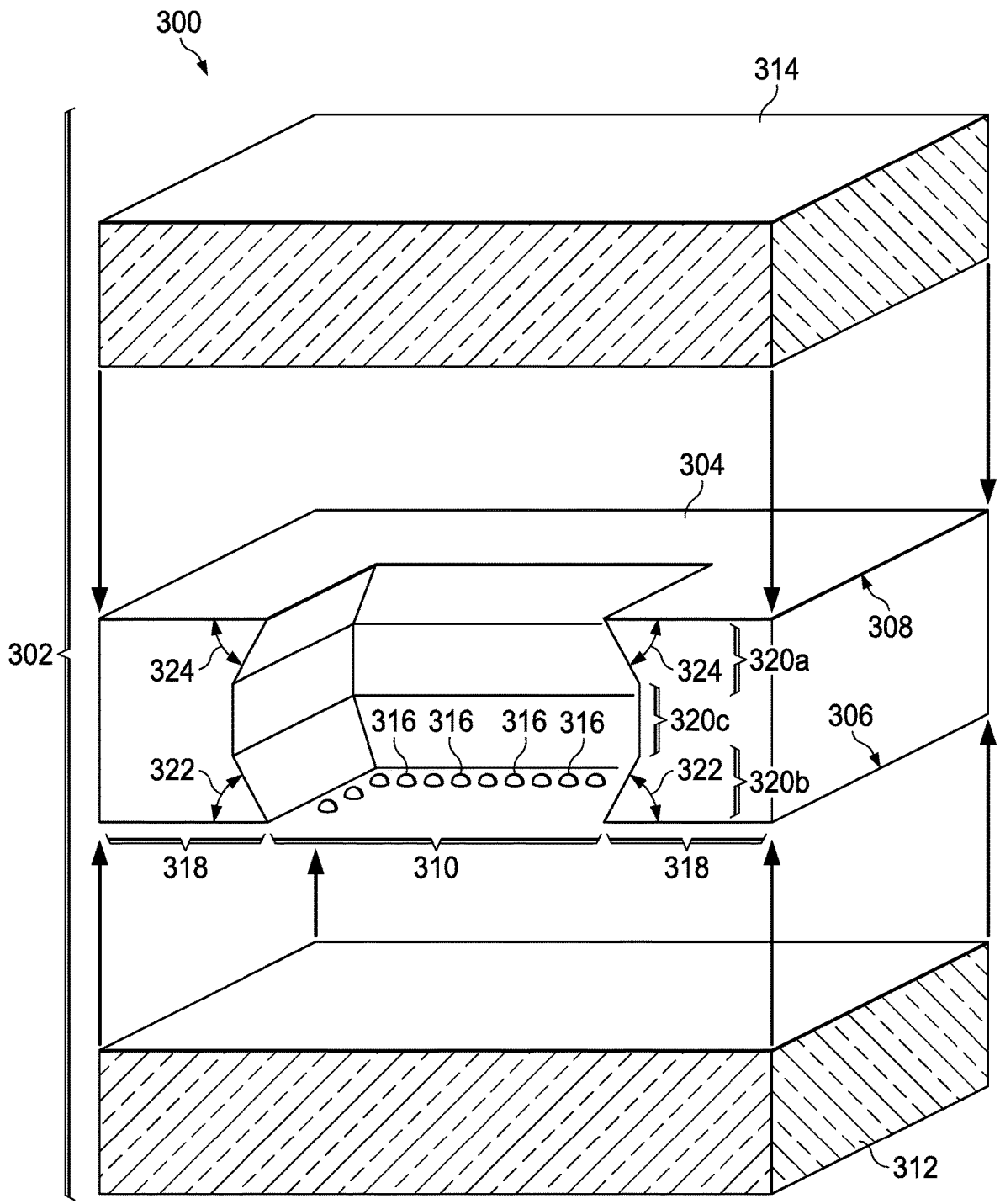
FIG. 3 is an exploded view of another example integrated microfabricated sensor.

FIG. 3 is an exploded view of another example integrated microfabricated sensor. The integrated microfabricated sensor 300 includes a sensor cell 302, which includes a cell body 304 having a first surface 306 which is flat, and a second surface 308, which is also flat, and is parallel to the first surface 306. The cell body 304 laterally surrounds a cavity 310 that extends from the first surface 306 through the cell body 304 to the second surface 308. A first window 312 is attached to the cell body 304 on the first surface 306, extending across the cavity 310 so as to be exposed to the cavity 310. A second window 314 is attached to the cell body 304 on the second surface 308, extending across the cavity 310 so as to be exposed to the cavity 310. The sensor cell 302 contains a sensor fluid material 316 in the cavity 310.

The cell body 304 has cell body walls 318 with concave profiles facing the cavity 310, so that the cavity 310 is wider in a central region 320c, than at a first boundary region 320a extending to the first surface 306 and at a second boundary region 320b extending to the second surface 308. In the instant example, the cell body walls 318 may be substantially vertical, that is, within a few degrees of perpendicular to the first surface 306 and the second surface 308, in the central region 320c, with straight facets extending from the central region 320c through the first boundary region 320a to the first surface 306 and from the central region 320c through the second boundary region 320b to the second surface 308. The cell body walls 318 have a first interior angle 322 at the first surface 306 which is acute around a perimeter of the cavity 310 at the first surface 306. Similarly, the cell body walls 318 have a second interior angle 324 at the second surface 308 which is acute around the perimeter of the cavity 310 at the second surface 308.

The integrated microfabricated sensor 300 includes a signal emitter, not shown in FIG. 3, located outside of the sensor cell 302, configured to emit an input signal through a signal path through the first window 312 into the cavity 310. The integrated microfabricated sensor 300 further includes a signal detector, also not shown in FIG. 3, located outside of the sensor cell 302, configured to detect an output signal through the signal path through the second window 314 from the cavity 310. The acute values of the first interior angle 322 and the second interior angle 324 may provide the advantage discussed in reference to FIG. 1.

Figure 4A:
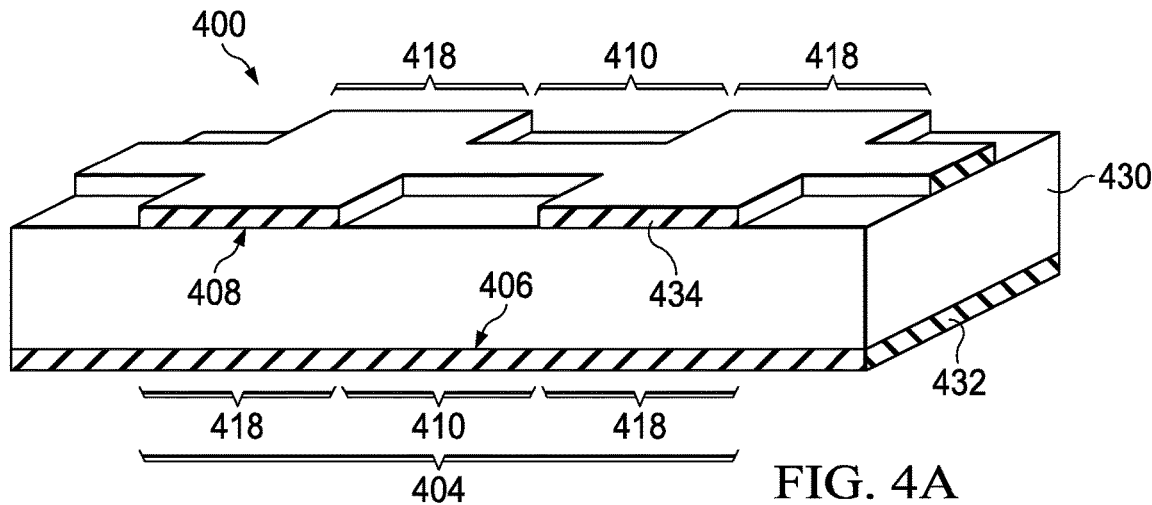
FIG. 4A through FIG. 4F are views of an integrated microfabricated sensor, depicted in successive stages of another example method of formation.

FIG. 4A through FIG. 4F are views of an integrated microfabricated sensor, depicted in successive stages of another example method of formation. Referring to FIG. 4A, a body substrate 430 is provided which includes areas for cell bodies, including the cell body 404 of the integrated microfabricated sensor 400. The body substrate 430 may be, for example, a single crystal wafer. Alternatively, the body substrate 430 may be a stack of different materials, bonded together. The body substrate 430 has a first surface 406 which is flat, and a second surface 408 which is flat and parallel to the first surface 406.

In the instant example, a first etch mask 432 and a second etch mask 434 are formed on the first surface 406 and the second surface 408, respectively. The first etch mask 432 covers the entire first surface 406. The second etch mask 434 covers areas on the second surface 408 for cell body walls 418 of the cell bodies and exposes areas for cavities 410 of the cell bodies.

The first etch mask 432 and the second etch mask 434 may be formed, for example, by forming a layer of silicon dioxide 0.5 micrometers to 1 micrometer thick concurrently on the first surface 406 and the second surface 408, followed by forming a layer of silicon nitride 0.5 micrometers to 1 micrometer thick concurrently on the first surface 406 and the second surface 408. Hard mask material, such as silicon carbide or amorphous carbon, may be formed over the silicon nitride on the second surface 408. Subsequently, a temporary mask, not shown in FIG. 4A, may be formed over the second surface 408, and the hard mask materials, silicon nitride, and silicon dioxide may be removed in areas exposed by the temporary mask, leaving the second etch mask 434 in place, followed by removing the temporary mask. Patterning the second etch mask 434 and leaving the first etch mask 432 unpatterned may advantageously reduce fabrication cost and complexity compared to patterning both the first etch mask 432 and the second etch mask 434. Other methods for forming the first etch mask 432 and the second etch mask 434 are within the scope of the instant example.

Figure 4B:
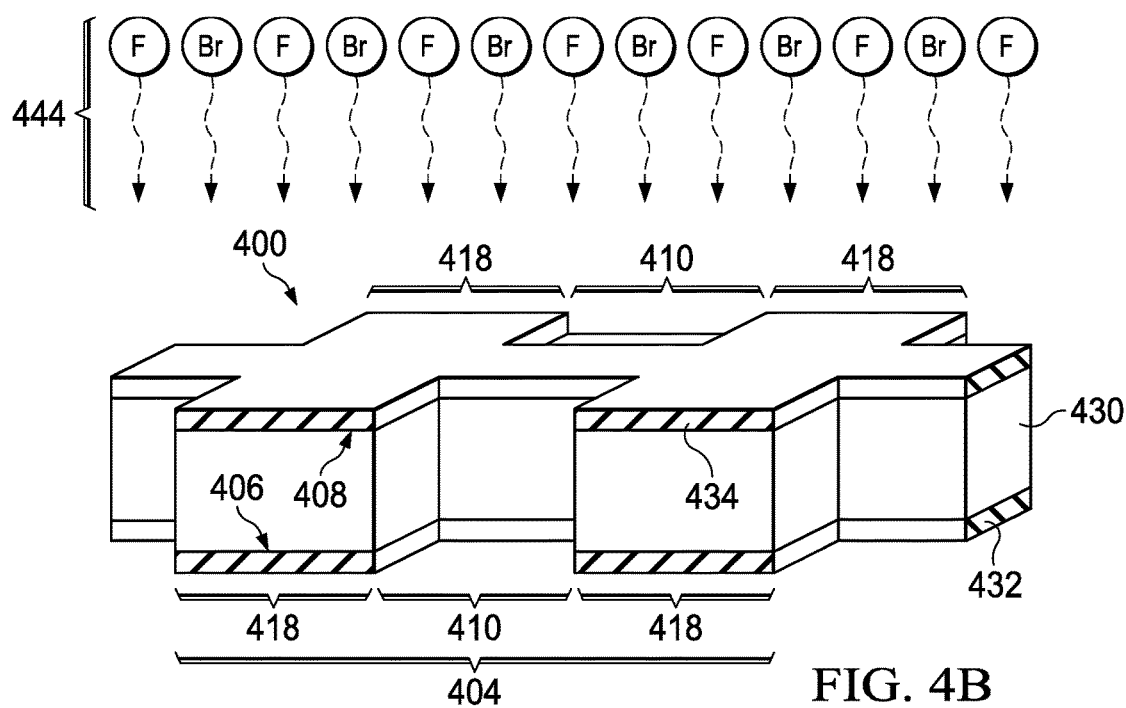

Referring to FIG. 4B, substrate material of the body substrate 430 is removed in areas exposed by the second etch mask 434 by a deep reactive ion etch (DRIE) process, for example using halogen radicals 444 such as fluorine, denoted "F" in FIG. 4B, and/or bromine, denoted "Br" in FIG. 4B. The DRIE process may alternate etching the body substrate 430 and passivating cell body walls of the body substrate 430 in the areas exposed by the second etch mask 434, such as the Bosch process. Alternatively, the DRIE process may be a continuous process which concurrently etches the body substrate 430 and passivates the cell body walls of the body substrate 430. The DRIE process is continued until the first etch mask 432 is exposed. A portion or all of the first etch mask 432 may be removed by the DRIE process, as indicated in FIG. 4B. The cell body walls 418 may have substantially vertical profiles after the DRIE process is completed.

Figure 4C:
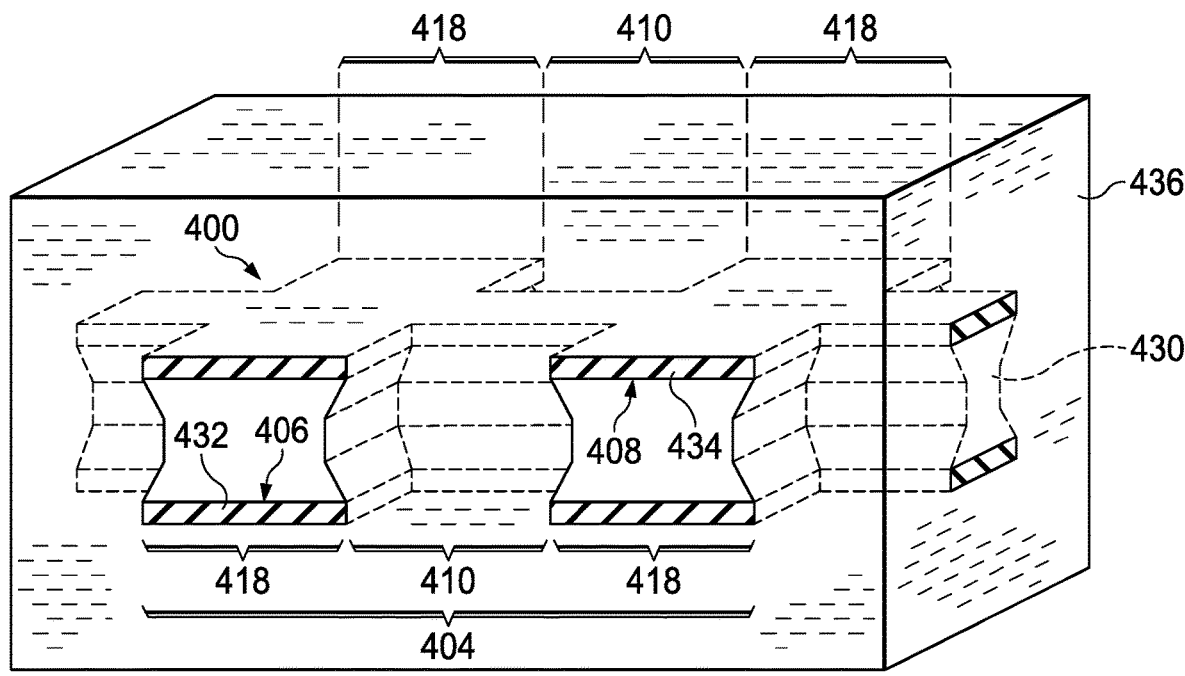

Referring to FIG. 4C, the body substrate 430, with the first etch mask 432 and the second etch mask 434 in place, is immersed in a wet etch bath 436 which removes substrate material from the cell body walls 418 to form faceted profiles at the first surface 406 and at the second surface 408, as shown in FIG. 4C. The wet etch bath 436 may include a crystallographic etchant solution as described in reference to FIG. 2B. The first etch mask 432 and the second etch mask 434 are subsequently removed.

Figure 4D:
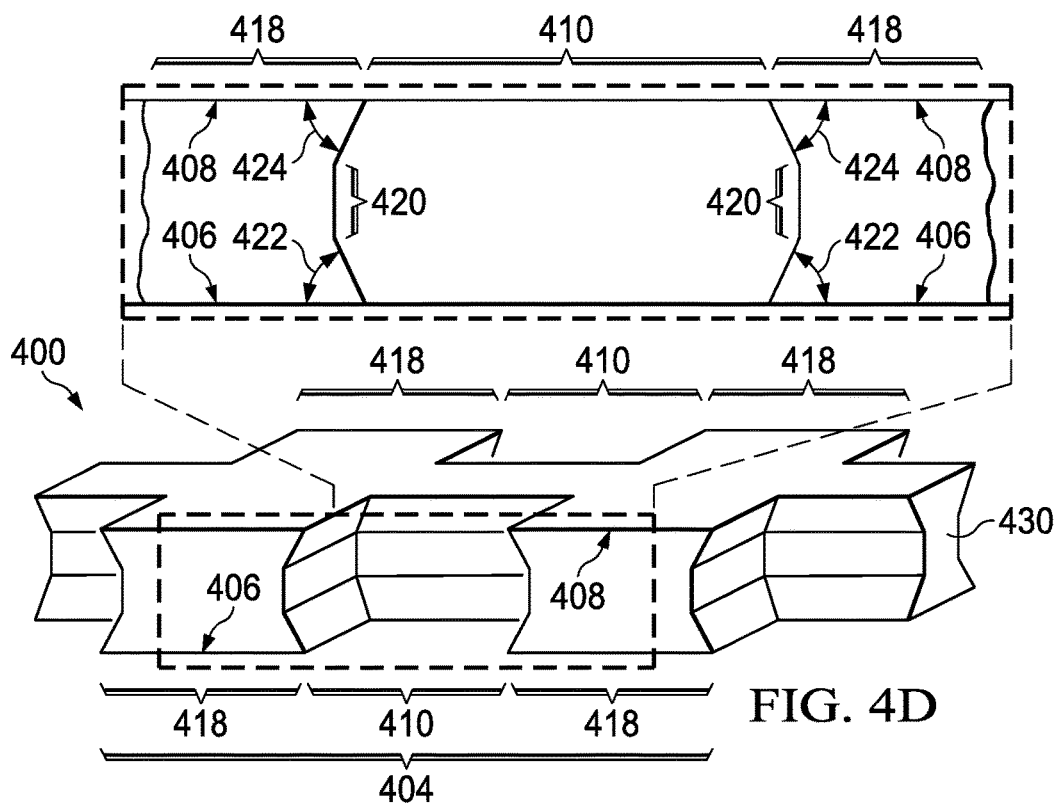

FIG. 4D depicts the body substrate 430 after the first etch mask 432 and the second etch mask 434 of FIG. 4C are removed. The cell body walls 418 have concave profiles, so that the cavity 410 is wider in a central region 420, approximately midway between the first surface 406 and the second surface 408, than at the first surface 406 and at the second surface 408. In the instant example, the cell body walls 418 may be substantially vertical in the central region 420, with straight facets extending from the central region 420 to the first surface 406 and from the central region 420 to the second surface 408. The cell body walls 418 have a first interior angle 422 at the first surface 406 which is acute around a perimeter of the cavity 410 at the first surface 406. Similarly, the cell body walls 418 have a second interior angle 424 at the second surface 408 which is acute around the perimeter of the cavity 410 at the second surface 408.

Figure 4E:
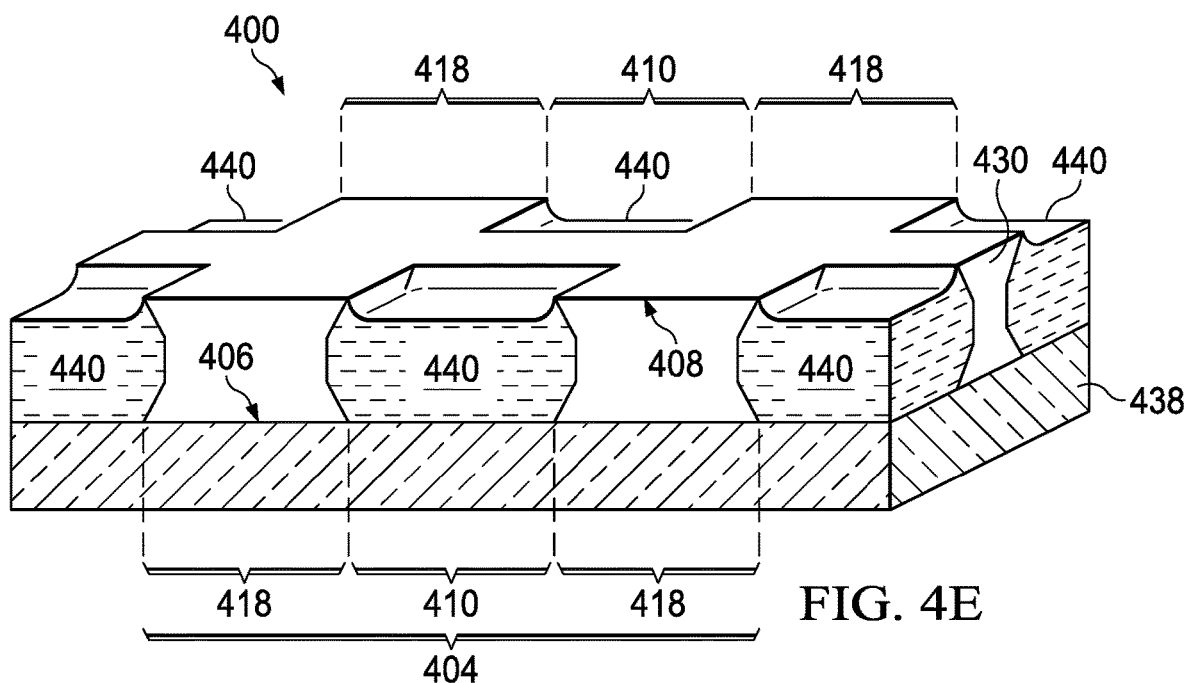

Referring to FIG. 4E, a first window substrate 438 is attached to the body substrate 430, on the first surface 406. A sensor fluid liquid solution 440 of a sensor fluid material dissolved in a solvent is disposed in the cavity 410. The sensor fluid liquid solution 440 may have a composition as described in reference to FIG. 2E. The sensor fluid liquid solution 440 may approximately fill the cavity 410. Substantially all of the solvent is subsequently removed from the sensor fluid liquid solution 440 by evaporation, leaving the sensor fluid material in the cavity 410. Evaporation of the solvent may be facilitated by heating the sensor fluid liquid solution 440, reducing an ambient pressure over the sensor fluid liquid solution 440, and/or flowing gas over the sensor fluid liquid solution 440 to remove solvent vapor. As the solvent evaporates, the sensor fluid material precipitates from the sensor fluid liquid solution 440 onto the cell body walls 418. The first interior angle 422 of FIG. 4D being acute and the second interior angle 424 of FIG. 4D being acute may provide the advantages discussed in reference to FIG. 2E.

Figure 4F:
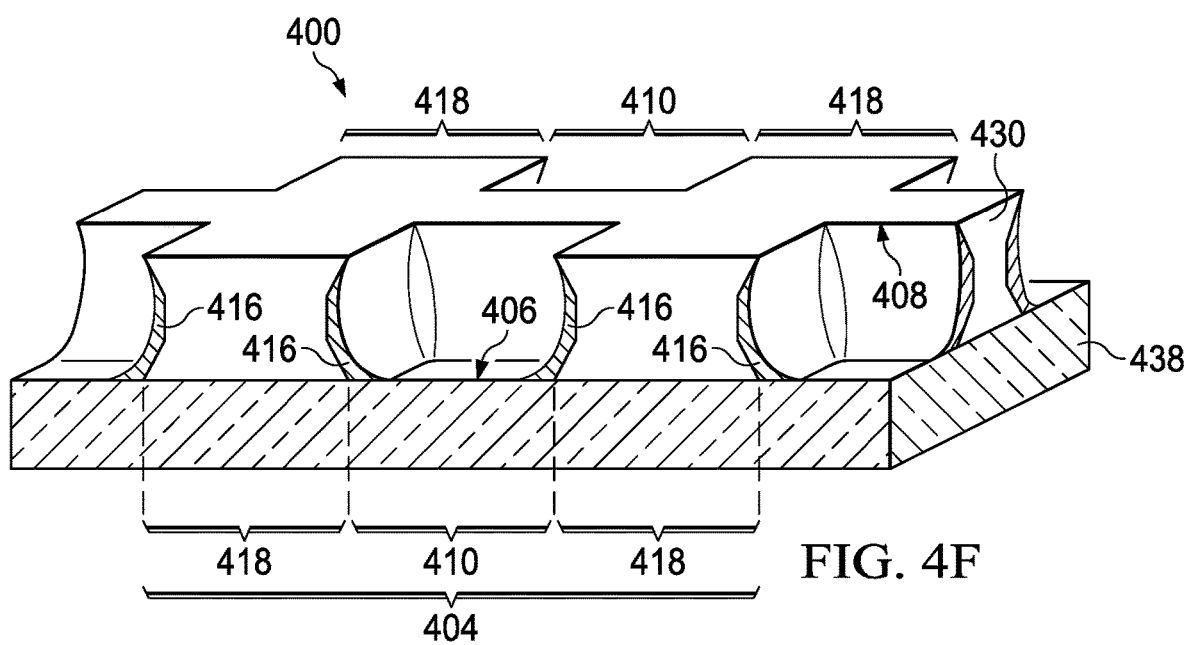

FIG. 4F depicts the body substrate 430 and attached first window substrate 438 after the solvent is evaporated from the sensor fluid liquid solution 440 of FIG. 4E. The sensor fluid material 416 is precipitated on the cell body walls 418 and on the first window substrate 438 around a perimeter of the cavity 410. Formation of the integrated microfabricated sensor 400 is continued by attaching a second window substrate, not shown, to the body substrate 430 at the second surface 408, and subsequently singulating the body substrate 430 with the attached first window substrate 438 and second window substrate.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated microfabricated sensor, comprising:
 a sensor cell, comprising:
  a cell body having:
   a first surface;
   a second surface parallel to the first surface; and
   cell body walls extending between the first surface and the second surface, the cell body walls having a concave profile defining a cavity having:
    a first boundary region along the first surface;
    a second boundary region along the second surface; and
    a central region between the first surface and the second surface, the central region being wider than the first boundary region and wider than the second boundary region;
  a first window adjacent to the first surface and exposed to the cavity;
  a second window adjacent to the second surface and exposed to the cavity; and
  a sensor fluid material in the cavity;
 a signal emitter outside of the cavity and proximate to the first window; and
 a signal detector outside of the cavity and proximate to the second window.

2. The integrated microfabricated sensor of claim 1, wherein the cell body walls have a first interior angle, extending from the cavity through the cell body walls to the first surface, the first interior angle being acute around a perimeter of the cavity at the first surface.

3. The integrated microfabricated sensor of claim 2, wherein the cell body walls have a second interior angle, extending from the cavity through the cell body walls to the second surface, the second interior angle being acute around a perimeter of the cavity at the second surface.

4. The integrated microfabricated sensor of claim 1, wherein:
 the cell body walls include crystalline silicon;
 first facets of the cell body walls in the first boundary region are aligned along first [111] crystal planes of the crystalline silicon; and
 second facets of the cell body walls in the second boundary region are aligned along second [111] crystal planes of the crystalline silicon.

5. The integrated microfabricated sensor of claim 4, wherein the first facets and second facets meet in the central region.

6. The integrated microfabricated sensor of claim 1, wherein the cell body walls have substantially vertical profiles in the central region.

7. The integrated microfabricated sensor of claim 1, wherein the sensor fluid material includes an alkali metal selected from the group consisting of cesium and rubidium.

8. A method, comprising:
 providing a cell body substrate having a first surface, and a second surface parallel to the first surface;
 removing material from the cell body substrate to form a cavity extending through the cell body substrate from the first surface to the second surface, wherein:
  a cell body has cell body walls extending between the first surface and the second surface; and
  the cell body walls have a concave profile, so that the cavity is wider in a central region, than at the first surface and at the second surface;

attaching a first window substrate to the cell body substrate at the first surface, the first window substrate being exposed to the cavity;

disposing a solution comprising a sensor fluid material and a solvent into the cavity on the first window substrate;

removing substantially all of the solvent; and attaching a second window substrate to the cell body substrate at the second surface, the second window substrate being exposed to the cavity.

9. The method of claim 8, wherein:

the cell body substrate comprises primarily crystalline silicon;

the cell body walls have a first interior angle, extending from the cavity through the cell body walls to the first surface, the first interior angle being acute around a perimeter of the cavity at the first surface; and the cell body walls have a second interior angle, extending from the cavity through the cell body walls to the second surface, the second interior angle being acute around a perimeter of the cavity at the second surface.

10. The method of claim 8, further comprising:

forming a first etch mask on the first surface of the cell body substrate, wherein the first etch mask exposes an area on the first surface for the cavity; and forming a second etch mask on the second surface of the cell body substrate, wherein the second etch mask exposes an area on the second surface for the cavity;

wherein removing the material from the cell body substrate comprises a wet etch process which concurrently removes the material from the cell body in the area exposed by the first mask and removes the material from the cell body in the area exposed by the second mask.

11. The method of claim 10, wherein the first etch mask comprises a first layer of silicon dioxide formed on the first surface of the cell body substrate, and further comprises a first layer of silicon nitride formed on the first layer of silicon dioxide, and the second etch mask comprises a second layer of silicon dioxide formed on the second surface of the cell body substrate, and further comprises a second layer of silicon nitride formed on the second layer of silicon dioxide.

12. The method of claim 11, wherein the first layer of silicon dioxide and the second layer of silicon dioxide are formed concurrently, and the first layer of silicon nitride and the second layer of silicon nitride are formed concurrently.

13. The method of claim 8, further comprising:

forming a first etch mask on the first surface of the cell body substrate, wherein the first etch mask exposes an area on the first surface for the cavity; and forming a second etch mask on the second surface of the cell body substrate, wherein the second etch mask covers the second surface;

wherein removing the material from the cell body substrate comprises:

performing a deep reactive ion etch (DRIE) process which removes the material in an anisotropic manner in the area exposed by the first etch mask; and performing a wet etch process which removes the material to form the cavity, the wet etch being performed after the DRIE process.

14. The method of claim 13, wherein the first etch mask comprises hard mask material selected from the group consisting of silicon carbide and amorphous carbon.

15. The method of claim 8, wherein removing the material from the cell body comprises a wet etch process with an aqueous alkaline solution.

16. The method of claim 8, wherein the cell body substrate is a silicon wafer having areas for cell bodies, and wherein removing the material from the cell body substrate is performed concurrently with removing material from the cell body substrate to form a cavity in each of the cell bodies.

17. The method of claim 8, wherein the sensor fluid material comprises an alkali metal salt and the solvent comprises a fluid selected from the group consisting of water and alcohol.

18. The method of claim 17, wherein the alkali metal salt comprises cesium azide.

19. The method of claim 8, wherein:

the first window substrate comprises a first glass layer;

attaching the first window substrate to the cell body substrate comprises a first anodic bonding process;

the second window substrate comprises a second glass layer; and attaching the second window substrate to the cell body substrate comprises a second anodic bonding process.

20. A method, comprising:

providing a cell body substrate having a first surface, and a second surface parallel to the first surface;

removing material from the cell body substrate to form a cavity extending through the cell body substrate from the first surface to the second surface, wherein:

a cell body has cell body walls extending between the first surface and the second surface; and the cell body walls have a concave profile, so that the cavity is wider in a central region, than at the first surface and at the second surface;

attaching a first window substrate to the cell body substrate at the first surface, the first window substrate being exposed to the cavity;

disposing a solution comprising a sensor fluid material and a solvent into the cavity on the first window substrate;

removing substantially all of the solvent;

attaching a second window substrate to the cell body substrate at the second surface, the second window substrate being exposed to the cavity;

forming a first etch mask on the first surface of the cell body substrate, wherein the first etch mask exposes an area on the first surface for the cavity;

forming a second etch mask on the second surface of the cell body substrate, wherein the second etch mask exposes an area on the second surface for the cavity, wherein removing the material from the cell body substrate comprises a wet etch process which concurrently removes the material from the cell body in the area exposed by the first mask and removes the material from the cell body in the area exposed by the second mask;

the first etch mask comprises a first layer of silicon dioxide formed on the first surface of the cell body substrate, and further comprises a first layer of silicon nitride formed on the first layer of silicon dioxide, and the second etch mask comprises a second layer of silicon dioxide formed on the second surface of the cell body substrate, and further comprises a second layer of silicon nitride formed on the second layer of silicon dioxide; and the first layer of silicon dioxide and the second layer of silicon dioxide are formed concurrently, and the first layer of silicon nitride and the second layer of silicon nitride are formed concurrently.

* * * * *